US010804899B2

(12) United States Patent
Grossauer et al.

(10) Patent No.: US 10,804,899 B2
(45) Date of Patent: Oct. 13, 2020

(54) INVERTER HOUSING

(71) Applicant: Fronius International GmbH, Pettenbach (AT)

(72) Inventors: Carina Grossauer, Pettenbach (AT); Sarim Ganglmair, Pettenbach (AT); Florian Maderthaner, Pettenbach (AT); Ronald Leitgeb, Pettenbach (AT)

(73) Assignee: Fronius International GmbH, Pettenbach (AT)

( * ) Notice: Subject to any disclaimer, the term of this patent is extended or adjusted under 35 U.S.C. 154(b) by 0 days.

(21) Appl. No.: 16/652,139

(22) PCT Filed: May 15, 2019

(86) PCT No.: PCT/EP2019/062513
§ 371 (c)(1),
(2) Date: Mar. 30, 2020

(87) PCT Pub. No.: WO2019/242944
PCT Pub. Date: Dec. 26, 2019

(65) Prior Publication Data
US 2020/0252065 A1    Aug. 6, 2020

(30) Foreign Application Priority Data
Jun. 19, 2018    (EP) .................................. 18178578

(51) Int. Cl.
*H03K 17/96*    (2006.01)
*H03K 5/00*    (2006.01)
(Continued)

(52) U.S. Cl.
CPC ....... *H03K 17/9638* (2013.01); *H03K 17/968* (2013.01); *H03K 17/9629* (2013.01);
(Continued)

(58) Field of Classification Search
CPC ........... H03K 17/9638; H03K 17/9629; H03K 17/9631; H03K 17/968; H03K 2217/94108; H05K 5/0017; H05K 7/1432
(Continued)

(56) References Cited

U.S. PATENT DOCUMENTS 8,035,045 B2    10/2011    Bremicker et al.
8,761,830 B2 *    6/2014    Kido ..................... H03K 17/941
455/556.1
(Continued)

FOREIGN PATENT DOCUMENTS

DE    10 2005 021 008 A1    12/2005
EP    2 577 869 B1    9/2013
(Continued)

OTHER PUBLICATIONS

International Search Report in PCT/EP2019/062513, dated Jul. 25, 2019.
(Continued)

*Primary Examiner* — Seung C Sohn
(74) *Attorney, Agent, or Firm* — Collard & Roe, P.C.

(57) ABSTRACT

The invention concerns an inverter housing (15) with at least two housing parts (16, 17), which can be detachably connected to one another by way of fastening elements (19), with a connection area (21), and an operation area (20) provided on a housing part (16, 17). In accordance with the invention, an optoelectronic control unit (1) is provided for purposes of operation, with at least one reflection light sensor (2), with in each case a light source (3) and in each case a light detector (4), evaluation electronics (5), and with an operating panel (6) for purposes of operating the reflection light sensor (2) as a result of the approach of an object (7), wherein a light guide (8) is arranged connected to a housing part (17), the other housing part (16) has a mounting
(Continued)

(25) for a circuit board (14), which contains the reflection light sensor (2) of the optoelectronic control unit (1), and a signal light source (9) for the emission of light in the visible wavelength range is arranged such that the light emitted by the signal light source (9) can be projected via the light guide (8) onto the operating panel (6), wherein the connection area (21) is arranged below the operation area (20).

9 Claims, 6 Drawing Sheets

(51) Int. Cl.
    *H05K 5/00*     (2006.01)
    *H05K 7/14*     (2006.01)
    *H03K 17/968*     (2006.01)

(52) U.S. Cl.
    CPC ....... *H03K 17/9631* (2013.01); *H05K 5/0017* (2013.01); *H05K 7/1432* (2013.01); *H03K 2217/94108* (2013.01)

(58) Field of Classification Search
    USPC .................................................. 250/216, 239
    See application file for complete search history.

(56) References Cited

U.S. PATENT DOCUMENTS

| | | |
|---|---|---|
| 9,000,348 B2 | 4/2015 | Fasthuber et al. |
| 2003/0020004 A1 | 1/2003 | Reime |
| 2013/0193314 A1 | 8/2013 | Schweninger et al. |

FOREIGN PATENT DOCUMENTS

| | | |
|---|---|---|
| FR | 2 866 194 A1 | 8/2005 |
| WO | 2014/160908 A2 | 10/2014 |

OTHER PUBLICATIONS

European Office Action in EP 18178578.3-1203, dated Feb. 20, 2019, with English translation of relevant parts.
Written Opinion of the International Searching Authority in PCT/EP2019/062513, dated Dec. 26, 2019.

* cited by examiner

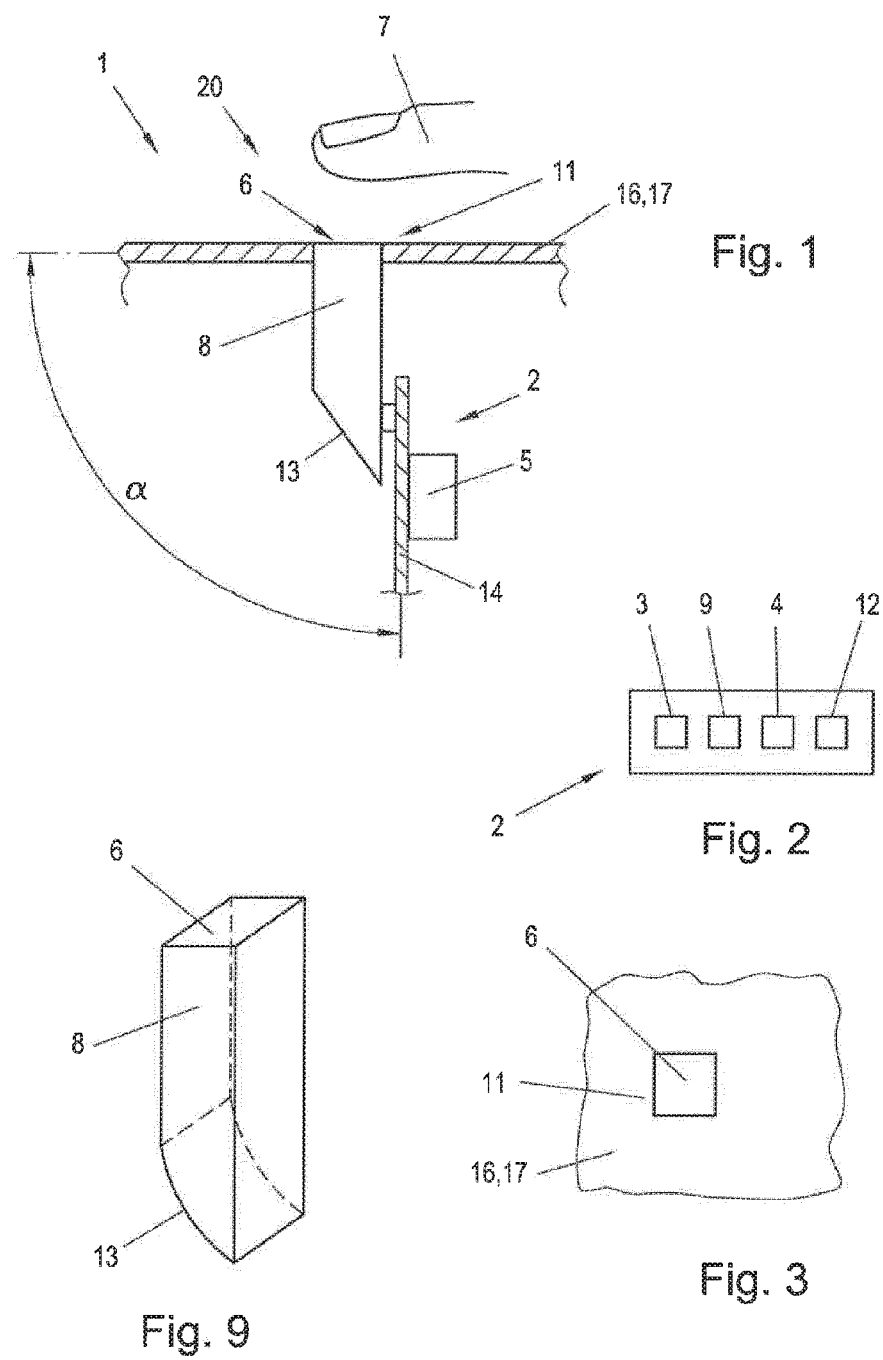

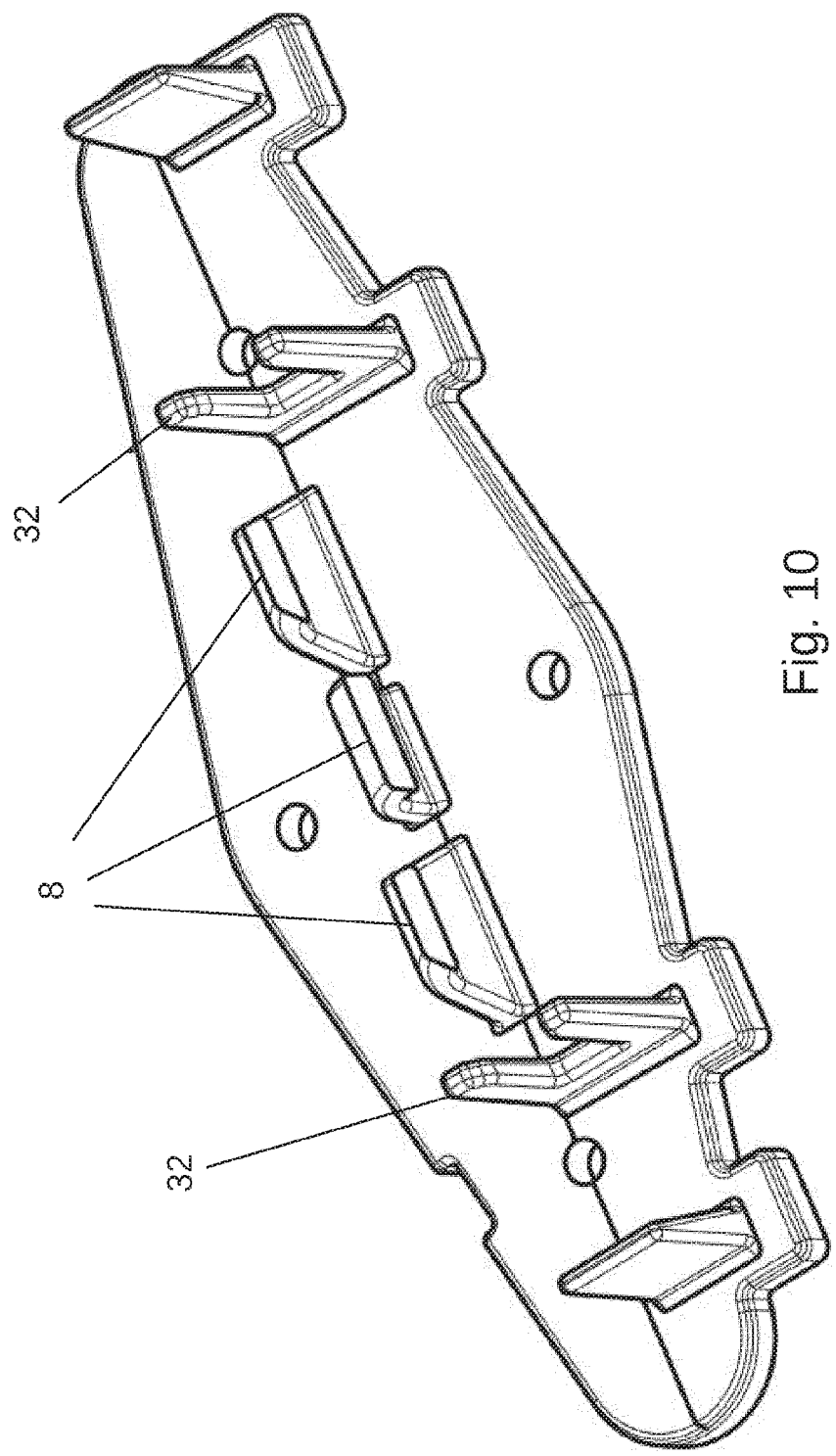

INVERTER HOUSING

CROSS REFERENCE TO RELATED APPLICATIONS

This application is the National Stage of PCT/EP2019/062513 filed on May 15, 2019, which claims priority under 35 U.S.C. § 119 of European Application No. 18178578.3 filed on Jun. 19, 2018, the disclosure of which is incorporated by reference. The international application under PCT article 21(2) was not published in English.

The invention concerns an inverter housing, with at least two housing parts, which can be detachably connected to each other by way of fastening elements, with a connection area, and an operation area provided on one housing part.

Usually, devices such as inverters, such as photovoltaic inverters, are operated using mechanical control elements, such as buttons or switches. Mechanical control elements are subject to a certain degree of wear and tear, and also require a relatively large amount of space on the respective device, which is not always available. In addition, the assembly and disassembly of mechanical control elements is relatively time-consuming, due to the necessary wiring, and is also prone to faults.

Improvements are provided by optoelectronic control units, which have the additional advantage that no parts under voltage have to be connected to the operation area of the respective device, for example the inverter, and thus a galvanic isolation of the control element from the respective device, for example the inverter, is achieved.

EP 2 577 869 B1 describes, for example, an optoelectronic control element, in which a light emitting diode, intended as a display, is used to carry out switching operations, for example by darkening the said light emitting diode with a finger of a user. However, this variant of a control unit still requires the wiring of the light emitting diode that is used as the control element, which entails corresponding assembly and disassembly effort.

In many devices, in particular inverters, such as photovoltaic inverters, the operation area is located on the side of the device housing, for example the inverter housing, that is externally accessible, whereas the circuit board, with the respective electronics and also the evaluation electronics for the optoelectronic control unit, is installed in the opposing part of the device housing. In the case of a photovoltaic inverter, the necessary connections for the photovoltaic modules and the connection to the supply network or the loads are usually arranged at the edge of the circuit board in a separate connection area, separated from the power area, whence appropriate supply lines lead through openings in the housing to the photovoltaic modules and to the supply network or the loads. When assembling, disassembling, and maintaining a device, in particular a photovoltaic inverter, it is necessary to open the inverter housing, which leads to increased effort in the wiring of the necessary control elements, since the connecting lines to the respective control element must be disconnected before the connection area in the device housing, that is to say, in the inverter housing, is freely accessible. In addition, any lines connecting to control elements must be appropriately insulated from lines connecting, for example, to photovoltaic modules or the supply network.

When optoelectronic control elements are used, such as is the case in US 2003/0020004 A1 or US 2013/0193314 A1, mechanical elements that are subject to greater wear can indeed be avoided, but wiring of the light sources and light detectors of the reflection light sensor to the respective evaluation electronics is still necessary, and must be appropriately insulated and made safe with respect to parts under voltage.

DE 10 2005 021 008 A1 also describes an optical switch or button, without, however, mentioning the arrangement in a housing, in particular in an inverter housing. The method uses a disturbance of the evanescent field to perform a switch function.

The object of the present invention is to create an inverter housing that enables optimum operation of the inverter, and wherein the respective assembly and disassembly effort can be minimised. In particular, a connection area of an inverter, for purposes of connecting and disconnecting the components, and for checking the inverter, should be particularly easily and quickly accessible. Disadvantages of the optoelectronic control units and inverter housings of known art should be avoided, or at least reduced.

The inventive object is solved by an inverter housing cited above, wherein an optoelectronic control unit for the operation of the inverter is provided, with at least one reflection light sensor, in each case with a light source and a light detector arranged next to the light source, evaluation electronics, and with an operating panel arranged above the light source and the light detector of each reflection light sensor for purposes of operating the reflection light sensor as a result of the approach of an object, wherein a light guide connected to a housing part is arranged between each operating panel and the light source and the light detector of a reflection light sensor, the other housing part has a mounting for a circuit board, which contains the reflection light sensor of the optoelectronic control unit, a signal light source for the emission of light in the visible wavelength range is arranged such that the light emitted by the signal light source in the visible wavelength range can be projected onto the operating panel via the light guide, and in that the connection area is arranged below the operation area. Such an inverter housing is characterised by simple and cost-effective production, but also by lower assembly and disassembly costs. The at least one light guide is connected to one housing part, or is integrally produced with the latter, whereas the electronics, including the reflection light sensor and the evaluation electronics, are mounted in the other housing part. Assuming an appropriate design, the housing parts only have to be connected to each other, and a connection between the operating panel and the reflection light sensor is automatically established, in that the at least one light guide bridges the distance between the operating panel and the reflection light sensor. It is not necessary to undertake any operations to connect the optoelectronic control unit to the evaluation electronics. Accordingly, the maintenance of a device equipped with such an optoelectronic control unit, for example an inverter, is also considerably simplified, since only one housing part has to be removed, and the connection area arranged below is then immediately accessible for maintenance. Wiring for control elements does not have to be removed before maintenance, as was previously the case. By the arrangement of a light guide between the reflection light sensor and the operating panel, the reflection light sensor can be positioned at a distance from the operating panel, thus avoiding the complex wiring of the reflection light sensor to the respective evaluation electronics. Thus the light guide provided between the reflection light sensor and the operating panel bridges the wiring that is normally present, as a result of which the effort required in the preparation and disassembly of the wiring is eliminated. Furthermore, as a result of the additional use of the light guide to transmit the visible light emitted by a signal light source to the operating panel, the wiring for signal lights and displays that is normally provided is avoided. The signal light source can be used as a signal to output a confirmation signal after operation of the optoelectronic control unit, or also to display certain operating states of the device. In any event, the optoelectronic control unit in question is characterised by the use of at least one light guide, both for receiving the operating information and for issuing an optical confirmation, or an optical signal. The optoelectronic control unit can also have a plurality of reflection light sensors and a plurality of operating panels, each of which is connected to the other by a light guide. The reflection light sensors each have at least one light source and at least one light detector, which are arranged side-by-side, and can detect the presence of an object, for example a finger of a user. The use of at least one light guide in this optoelectronic control unit allows greater design freedom in the design of the housing of the device that is to be operated, for example the inverter housing, and avoids the problem of wiring to the front face of the housing associated with mechanical buttons or switches. In addition to the other known advantages of optoelectronic control units, such as galvanic isolation and robustness against electromagnetic influences and mechanical wear, such optoelectronic control units are also more flexible, since a single operating panel can be used to trigger various functions by designing and programming the evaluation electronics accordingly. For example, the approach, or even the approach speed, of the finger to the operating panel can also be detected. The optoelectronic control unit in question is characterised by its simple design and low manufacturing costs. Advantageously the operating panel or the light guide with the operating panel is manufactured together with a housing part of the inverter housing. A two-component or multi-component injection moulding process is preferably suitable for the manufacture of the corresponding housing part. In two-component or multi-component injection moulding processes, two or more different plastics are processed one after the other, as a result of which the manufactured article can be given specific designs or properties. In the case of the inverter housing in question, for example, the housing part can be made of a suitable opaque plastic material such as polypropylene, whereas polycarbonates are preferably used for the at least one light guide. If a plurality of light guides are provided for connecting a plurality of control surfaces to a plurality of reflection light sensors, these light guides can also be connected to one another via at least one common web, as a result of which the mechanical robustness of the light guides and the associated housing part can be increased.

A seal may be arranged between the at least two housing parts. In particular, if the housing is used outdoors, as is usual with inverter housings, such a seal is absolutely necessary and advantageous so as to increase the service life of the electronic components contained in the inverter housing. In the simplest case, the seal can be formed by a peripheral band or similar made of an elastic material such as silicone.

If the signal light source of the optoelectronic control unit is located between the light source and the light detector of a reflection light sensor, space can be saved on the one hand, and on the other hand the signal light source creates a separation between the light source and the light detector of the reflection light sensor. The signal light source for emitting a confirmation signal for confirming operation of the optoelectronic control unit is thus arranged in the centre of the reflection light sensor, so that the same light guide that is arranged to transmit the light of the reflection light sensor can also be used to transmit the light of the signal light source. The light from the signal light source is then projected onto the operating panel, which at the same time serves to operate the optoelectronic control unit. This arrangement is particularly advantageous when using the signal light source to provide a feedback signal for the operation of the optoelectronic control unit, since the correct operation of the optoelectronic control unit can be clearly indicated by illuminating the operating panel. The reflection light sensors can, if necessary, be manufactured in combination with one or a plurality of signal light sources using today's usual semiconductor technologies in a particularly small and space-saving, but also cost-effective, manner.

According to a feature of the invention, the operating panel of the optoelectronic control unit is formed by the light guide. In this case, the front face of the light guide is itself used as the operating panel, which is why no separate component has to be provided to form the operating panel. The size and shape of the operating panel can be influenced by the configuration of the cross-section of the light guide.

The light source and the light detector of the reflection light sensor can be formed by an infrared light emitting diode and an infrared detector, preferably with emission or detection maxima at a wavelength between 850 nm and 900 nm. These wavelength ranges are advantageous for detection, since the visible ambient light has less influence on the detection. The sensitivity of the optoelectronic control unit can also be increased by using infrared light.

If the signal light source for emitting light in the visible wavelength range is formed by an RGB light emitting diode, the signal light source can be used to emit signals in different colours. Multi-colour RGB LEDs, which combine red, green and blue LEDs, can be used to emit a wide variety of colours by an appropriate mixing of the intensities of the individual LEDs. Such light-emitting diodes are now also available at particularly low cost.

The light guide of the optoelectronic control unit is ideally made of polycarbonates and is preferably manufactured by injection moulding. Polycarbonates are thermoplastics that can be processed relatively easily, and furthermore can also conduct light particularly well, that is to say, are accordingly transparent to light. In addition, polycarbonates can also be coloured, further enhancing the options for the configuration of the optoelectronic control unit, or the housing fitted with the optoelectronic control unit.

Alternatively, the light guide can also be made of other transparent and light conducting materials, such as glass. Although glass is more complex to manufacture, it can be advantageous compared with plastics in terms of ageing.

In addition, a light sensor for detecting ambient light can be provided, and preferably arranged next to the reflection light sensor, which light sensor is connected to the evaluation electronics. By arranging a light sensor to detect ambient light, the light intensity of the signal light source can be adjusted to the ambient light, in a similar manner as is of known art for the brightness of the screen of displays, for example, of smart phones. If the light sensor for detecting ambient light is located next to the reflection light sensor, it can analyse and evaluate the ambient light penetrating via the light guide. Alternatively, the light sensor for detecting ambient light can be placed at another suitable location on the device housing, which is provided with the optoelectronic control unit.

If the mounting for the circuit board is designed such that the circuit board is arranged at an angle between 10° and 170°, preferably at essentially 90°, relative to the operating panel, a more flexible assembly of the optoelectronic control unit in the inverter housing can be achieved. An arrangement essentially at right angles between operating panel and reflection light sensor is advantageous in many practical applications, if the front surface or operating panel of a device is arranged essentially at right angles to the circuit board, which also has the evaluation electronics of the optoelectronic control unit and the reflection light sensor.

The operating panel and/or the deflection surface of the light guide is preferably of polished construction. The sensitivity of the optoelectronic control unit can be increased by polishing the control surface, since less stray light is captured, which could influence the sensitivity of the triggering of the reflection light sensor. Polishing the deflection surface for the deflection of the light in the light guide has also proved to be advantageous, since by this means the reflection properties of the light transported in the light guide can be improved and losses can be minimised. This results in longer distances that can be bridged with the light guide between the operating panel and the reflection light sensor.

The inventive task is also solved by an inverter housing with at least two housing parts, which can be detachably connected to each other by way of fastening elements, a connection area and an operation area provided on a housing part, wherein each fastening element is formed by a rotary pin and a leaf spring with an opening for the reception of one end of the rotary pin, wherein the rotary pin in the open position can be brought out of or into the opening of the leaf spring, and in a closed position, which is rotated relative to the open position, fixes the leaf spring, which is preloaded in the axial direction. This design of the fastening element makes it possible to fasten the housing parts of the inverter housing easily and quickly, thus facilitating assembly and disassembly. At the same time, an optimum tightness of the inverter housing can be achieved by the appropriate configuration of the fastening elements, which is also usually necessary, since inverter housings are generally designed for arrangement in the outdoor environment. The operation of the rotary pin of each fastening element can be done manually by an appropriate configuration of the head of the rotary pin, or by using a suitable tool, such as a screwdriver, which can be inserted into a socket provided for this purpose on the head of the rotary pin.

In the closed position, the rotary pin of each fastening element preferably engages in the opening of the leaf spring. The engagement or locking of the rotating pin in the leaf spring on the one hand supports retention in the closed position and prevents unintentional opening of the fastening element. On the other hand, by an appropriate configuration of the leaf spring and the housing part, it is possible to ensure that an acoustic signal is emitted by the leaf spring in combination with the housing part when the rotary pin engages in the closed position, and that a resistance is generated which must be overcome with a detectable jerk when the fastening element is closed. This indicates to the fitter that the device has engaged correctly in the closed position. The fitter must therefore operate the fastening element, for example by turning it a quarter of a turn, until he hears the audible signal and detects that the resistance has been overcome, to ensure that the fastening element is properly in the closed position. As described above, the audible signal and the detectable resistance may also be utilised when the fastening element is opened.

It is advantageous that in the lower region of each rotary pin there is a connecting member with a detent lug, and that the opening of each leaf spring has detent lugs, so that when the rotary pin is rotated through 90° a secure connection of the housing parts under a preload on the leaf spring is ensured. By an appropriate configuration of the detent lug on the rotary pin and the leaf spring and its preload, together with the housing part, an acoustic signal can be generated when the rotary pin engages in the closed position and, if necessary, when the rotary pin is opened, indicating to the fitter that the closed or open position has been achieved correctly. The fitter also detects the overcoming of the detent lug by a corresponding jerk when the closed or open position of the fastening element has been achieved.

In accordance with another feature of the invention, the leaf spring of each fastening element is made of hardened metal.

The invention is explained in more detail with the aid of the appended drawings. Here:

FIG. 1 shows in a cross-sectional representation an optoelectronic control unit of the present invention installed in one part of an inverter housing;

FIG. 2 shows a view onto the reflection light sensor of the optoelectronic control unit as shown in FIG. 1;

FIG. 3 shows a plan view onto the operating panel of the optoelectronic control unit as shown in FIG. 1;

FIG. 9 shows in a perspective view a variant of the light guide of the optoelectronic control unit as shown in FIG. 1;

FIG. 10 shows a perspective view of a form of embodiment of an optical waveguide of an optoelectronic control unit with elements for centring a circuit board, which contains the reflection light sensor.

Figure 4:
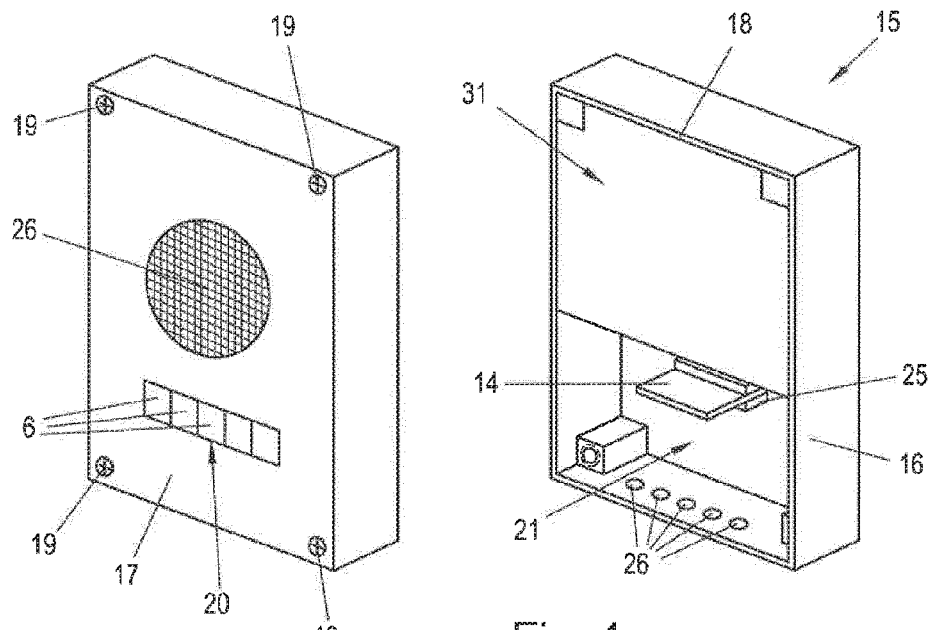
FIG. 4 shows the principles of an inverter housing in an exploded view.

FIG. 1 shows a cross-sectional representation of an optoelectronic control unit 1 of the present invention installed in one part of an inverter housing 15. An optoelectronic control unit 1 is arranged in one housing part 16 or 17 of the inverter housing 15 so as to form the operation area 20, which control unit 1 has at least one reflection light sensor 2, which in each case contains at least one light source 3 and one light detector 4, arranged next to the light source 3 (see FIG. 2). The reflection light sensor 2 is connected to appropriate evaluation electronics 5, and is accordingly actuated, via an operating panel 6, by the approach of an object 7, for example a finger of an operator. In accordance with the invention, a light guide 8 is arranged between each operating panel 6 and the light source 3 and the light detector 4 of a reflection light sensor 2, via which light guide 8 the light of the light source 3 of the reflection light sensor 2 can be directed onto the operating panel 6, and from there back to the light detector 4. In the event of a deflection of the direction of the light, an appropriate deflection surface 13 is arranged in the light guide 8. The operating panel 6 can be designed separately, or formed by the front face of the light guide 8. In the example of embodiment shown, the reflection light sensor 2 and the corresponding evaluation electronics 5 are arranged on a circuit board 14, which here is arranged at an angle α of essentially 90° to the operating panel 6. The operating panel 6 is level with the surface of the housing part 16 or 17. The deflection surface 13 of the light guide 8 deflects the light through this angle α accordingly. If other angles α are used, the light guide 8 only needs to be reconfigured so that the light from the reflection light sensor 2 can be redirected to the operating panel 6. A signal light source 9 is arranged on the circuit board 14, preferably between the light source 2 and the light detector 4 of the reflection light sensor 2 (see FIG. 2); the light of the signal light source 9 in the visible wavelength range can also be projected onto the operating panel 6 via the light guide 8. The light source 3 and the light detector 4 of the reflection light sensor 2 are preferably formed by an infrared light emitting diode and an infrared detector, preferably with transmission or detection maxima, at a wavelength λ between 850 nm and 900 nm. The signal light source 9 can, for example, be formed by an RGB light emitting diode so as to enable the emission of variously coloured light.

The light guide 8 is preferably made from polycarbonates and is preferably manufactured by an injection moulding process. However, manufacture from glass is also possible. A light sensor 12 can be provided for the detection of ambient light, preferably next to the reflection light sensor 2, that is to say, next to its light source 3 or light detector 4, and can preferably be connected to the evaluation electronics 5.

As can be seen from the plan view onto the operating panel 6 as shown in FIG. 3, the operating panel 6 is preferably of a different character than that of the surrounding surface 11, and is preferably polished, so that, on the one hand, the operating panel 6 can be shown raised above the surrounding surface 11, and, on the other hand, the sensitivity of the optoelectronic control unit 1 can be increased.

The evaluation of the reflection light sensor 2 in the evaluation electronics 5 is preferably carried out by software, by recording the duration and degree of darkening of the operating panel 6 by the object 7, and comparing it with preset values. By this means various operating patterns can be interrogated and various functions of the device can be triggered. For example, a long or short darkening of the operating panel 6 by an object 7, or a multiple covering of the operating panel 6 by an object 7 within a specified time period, can be detected and used to trigger certain functions of the device.

The optical control unit 1 shown here is characterised by reduced assembly and disassembly effort, as no wiring is required between the operation area 20 on the housing part 16 or 17 and the reflection light sensor 2 or the evaluation electronics 5, if the housing parts 16, 17 are detached in order to be able to assemble or disassemble the device, or to carry out maintenance. The length and configuration of the light guide 8 can vary within relatively wide limits, and the light guide 8 and the corresponding housing part 16 or 17 can be manufactured relatively easily and inexpensively in a manufacturing process, or the light guide 8 can be attached relatively easily to the housing part 16, 17.

FIG. 4 shows in an exploded view the principle of an inverter housing 15, as it is used for a photovoltaic inverter. The inverter housing 15 essentially consists of two housing parts 16, 17, which can be detachably connected to each other by way of appropriate fastening elements 19. On the one housing part 16 of the inverter housing 15, which is usually mounted on a wall or similar (not shown), there is usually in the lower region a connection area 21, which is separated from a power area 31, which has the power electronic components of the inverter. In the connection area 21, the photovoltaic modules are connected to the DC input of the inverter, and the loads and the supply network are connected to the AC output of the inverter by way of appropriate plug connections or similar (not shown). The corresponding supply lines to the photovoltaic modules and loads, or to the load network, run through appropriate openings 26 in the housing part 16. In the connection area 21 of the housing part 16 there are mountings 25 for a circuit board 14, which hold the necessary components of the optoelectronic control unit 1, such as the reflection light sensor 2 and the evaluation electronics 5. The two housing parts 16, 17 are appropriately sealed by way of a seal 18 in the closed state.

The fastening elements 19 are appropriately arranged in the front part 17 of the inverter housing 15, and the control elements for operating the inverter are located in the operation area 20. In accordance with the invention, the operating panels 6 of the optoelectronic control unit 1 (see FIGS. 1-3) are located in the operation area 20 of the housing part 17, so that a simple and uncomplicated operation of the inverter functions is made possible. At the same time, the operating panels 6 serve to output optical signals by way of the signal light sources 9 by way of the corresponding operating panels 6.

It is also advantageous for the operation area 20 to be arranged above the connection area 21 in the other housing part 16, so that the components of the optoelectronic control unit 1 do not interfere with the wiring in the connection area 21. The housing part 17, or only a part of it, such as e.g. an appropriately designed cover (not shown), can also easily be opened and closed to allow access to the connection area 21. The housing part 17 can also be made up of two or more parts, so that, for example, the connection area 21 and the power area 31 can be opened separately from one another.

Figure 5:
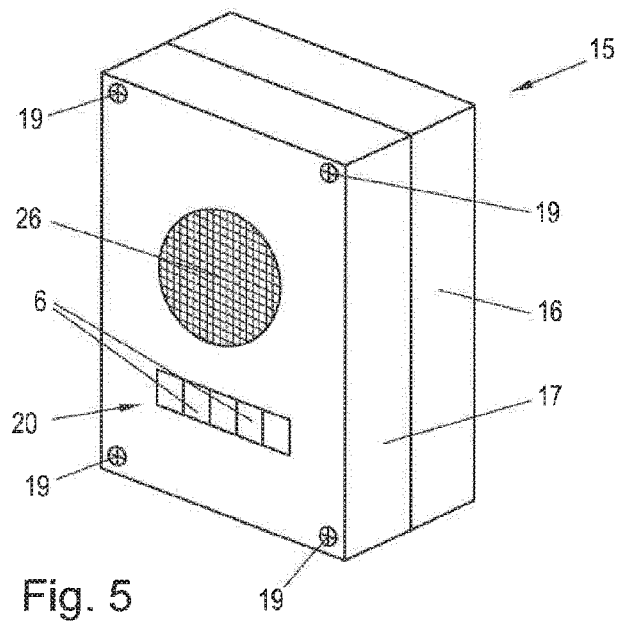
FIG. 5 shows the inverter housing as shown in FIG. 4 in an assembled state.

FIG. 5 shows the inverter housing 15 as shown in FIG. 4 in an assembled state. When the inverter housing 15 is closed, the two housing parts 16 and 17 are located one above another, and the fastening elements 19 are brought into the closed position. The inverter can thus be controlled or switched on and off by way of the operating panels 6 of the optoelectronic control unit. If the fastening elements 19 are fastened correctly, an appropriate degree of sealing is achieved between the two housing parts 16, 17, which is ensured and improved by the seal 18 shown and described in FIG. 4.

Figure 6:
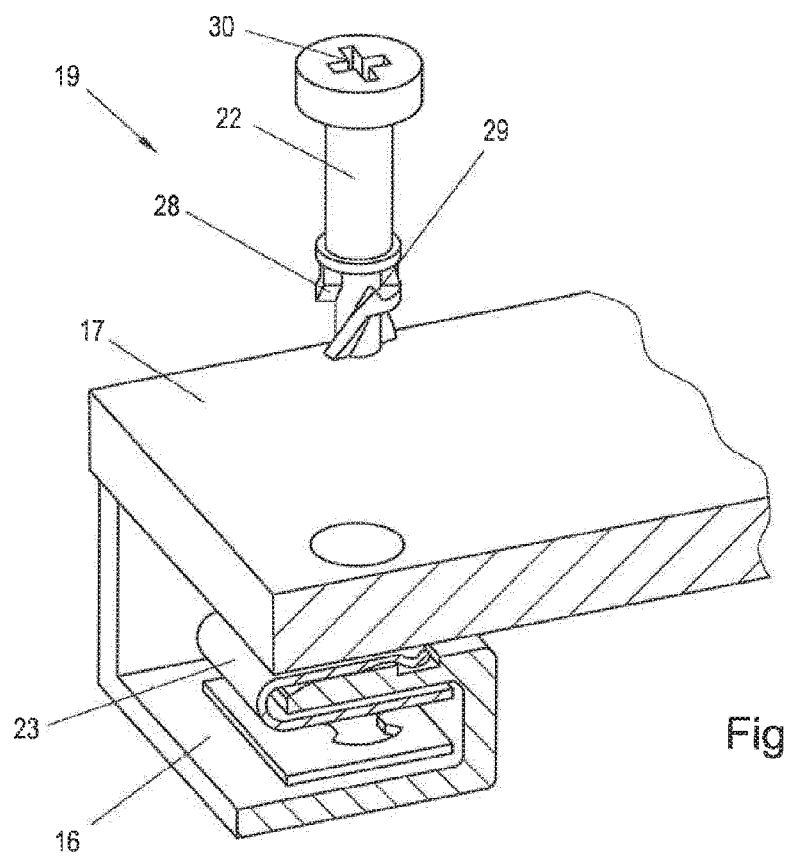
FIG. 6 shows an exploded view of a form of embodiment of a fastening element for fastening the housing parts of an inverter housing.
Figure 8:
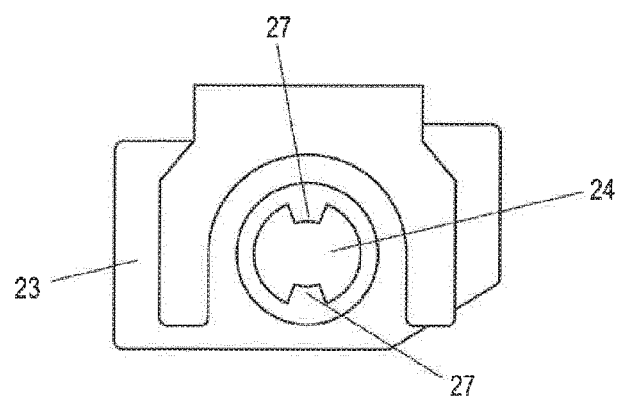
FIG. 8 shows a plan view onto the leaf spring of the fastening element as shown in FIGS. 6 and 7.

FIG. 6 shows an exploded view of a form of embodiment of a fastening element 19 for fastening the housing parts 16, 17 of an inverter housing 15. The two housing parts 16, 17 are connected to each other by way of the fastening element 19, wherein the fastening element 19 consists of a rotary pin 22 and a leaf spring 23. The rotary pin 22 has a socket 30 on its head for an appropriate tool, for example a screwdriver (not shown). In the lower region of the rotary pin 22 a connecting member 28 is arranged, with a detent lug 29, which latches into a corresponding opening 24 with detent lugs 27 in the leaf spring 23 (see FIG. 8) and when turned through 90° ensures a secure connection of the two housing parts 16 and 17 under a preload on the leaf spring 23. By an appropriate configuration of the detent lug 29 on the rotary pin 22, and the leaf spring 23 and its preload, together with the housing part 16, it is possible to produce an acoustic signal when the rotary pin 22 engages in the closed position and, if need be, when the rotary pin 22 is opened, which indicates to the fitter that the closed or open position has been achieved correctly. The fitter also detects the overcoming of the detent lug 29 in terms of a corresponding jerk, when the closed or open position of the fastening element 19 has been achieved. Ideally, the leaf spring 23 is produced from a hardened metal, in particular Saar steel C67S, and preferably has a force of 100 N to 150 N, in particular 125 N, in the parallel state. The housing part 16 is preferably produced from die-cast aluminium. The housing part 17 can also be made of plastic.

Figure 7:
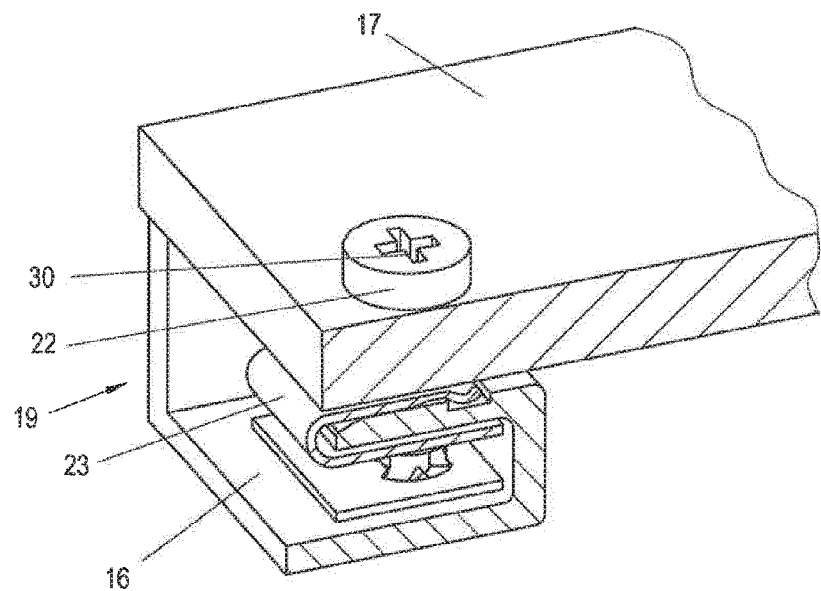
FIG. 7 shows the fastening element as shown in FIG. 6 in the assembled state of the housing parts of the inverter housing.

FIG. 7 shows the fastening element 19 as shown in FIG. 6 in the assembled state of the housing parts 16, 17 of the inverter housing 15. Due to the preload on the leaf spring 23 and the fastening element 19, rotated in the closed position, the housing part 16 is accordingly braced with respect to the housing part 17, as a result of which an optimum degree of sealing for the inverter housing 15 can be achieved, if need be with the interposition of a seal 18 (not shown). The preload on the leaf springs 23 ensures that the force required to achieve an appropriate degree of sealing of the inverter housing 15 can be built up by means of the fastening elements 19. The detent of the fastening element 19 into the closed position is also effected with an increased force and acceleration by the preload on the leaf spring 23, as a result of which the acoustic signal when the fastening element 19 locks into the closed or open position is also amplified.

Finally FIG. 9 shows in a perspective view a variant of the light guide 8 of the optoelectronic control unit 1 shown in FIG. 1. In this variant, the deflection surface 13 of the light guide 9 is curved in comparison with the form of embodiment shown in FIG. 1; this can lead to an improvement in the guidance of the light within the light guide 8. As already mentioned for the embodiment variant of the light guide 8 shown in FIG. 1, the deflection surface 13 is preferably of polished construction. However, virtually no limits are set to the configuration of the light guide 8.

FIG. 10 shows a perspective view onto a form of embodiment of a light guide 8 of an optoelectronic control unit 1 with elements 32 for purposes of centring a circuit board 14, which contains the reflection light sensor 2. The centring elements 32 are preferably produced together with the light guides 8 and the operating panel 6, for example in a multi-component injection moulding process. A possible seal 33 made of a soft material around the operating panel 6 can also be provided in this production process. This seal (see FIG. 11) ensures that no moisture can penetrate into the inverter housing 15 between the operating panel 6 and the housing part 17.

Figure 11:
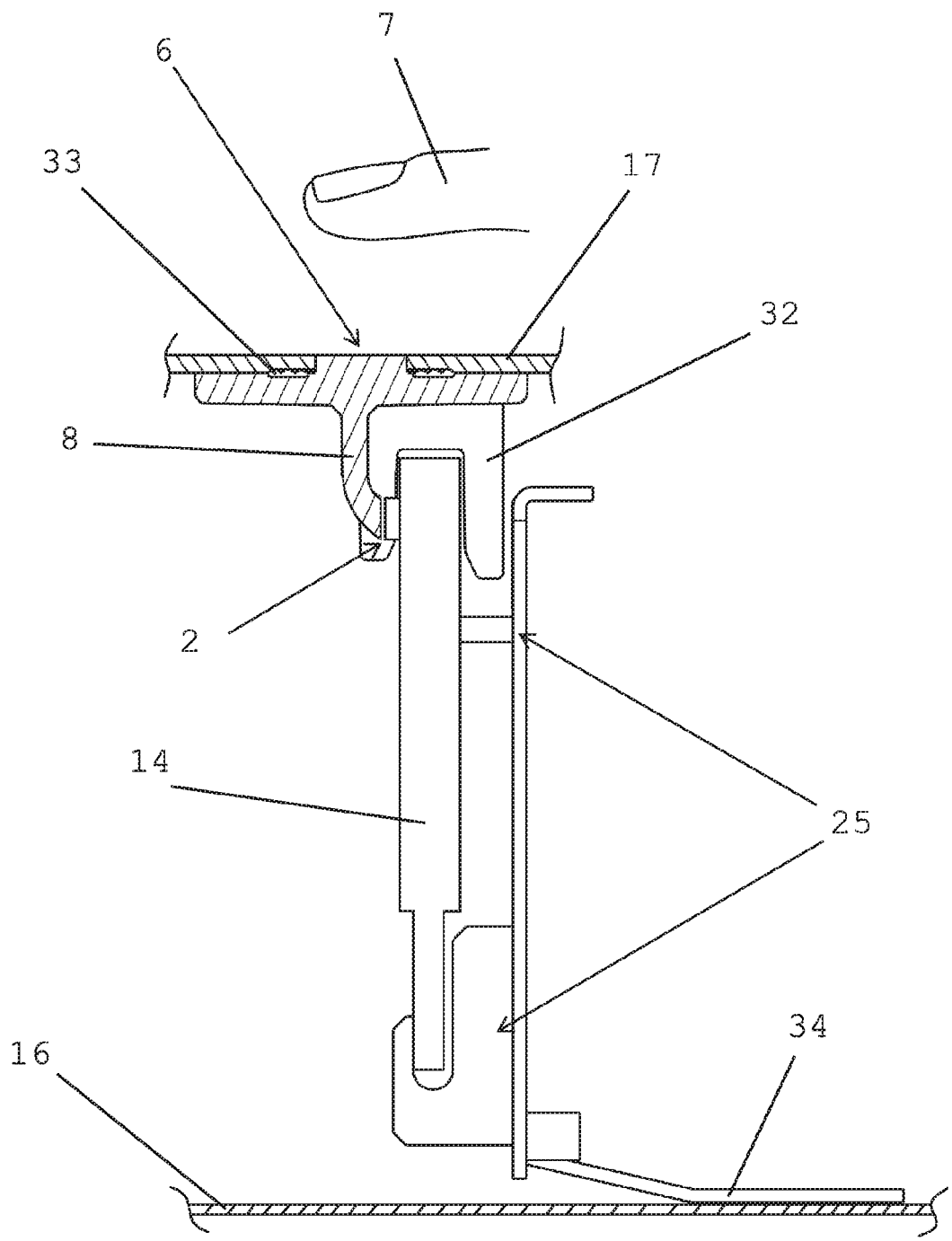
FIG. 11 shows a cross-sectional view through the arrangement as shown in FIG. 10, with the circuit board connected to the latter.

From the cross-sectional drawing shown in FIG. 11 the arrangement of the circuit board 14 in the centring elements 32 of the optoelectronic control unit 1 can be seen more clearly. Accordingly, the light guide 8 is arranged together with the operating panel 6 in the housing part 17, wherein a seal 33 can be arranged from a more elastic material. When the housing part 17 is closed, which can also occur by pivoting it relative to the other housing part 16, the circuit board 14 with the reflection light sensor 2 arranged on it is brought into the desired position by way of the centring elements 32 on the light guide 8, so that the lower part of the light guide 8 accordingly touches the reflection light sensor 2, or is spaced apart from the latter, and light can be guided between the operating panel 6 and the reflection light sensor 2 via the light guide 8. If the mounting 25 for the circuit board 14 in the housing part 16 is spring-mounted by way of spring elements 34 configured accordingly, an even better alignment of the light guide 8 relative to the circuit board 14 can be achieved, and even larger tolerances can be compensated for, without excessive loading on the circuit board 14 or the light guide 8.

The invention claimed is:

1. An inverter housing (15), with at least two housing parts (16, 17), which can be detachably connected to one another via fastening elements (19), with a connection area (21) and an operation area (20) provided on a housing part (16, 17), comprising an optoelectronic control unit (1), with at least one reflection light sensor (2), with in each case a light source (3) and a light detector (4) arranged next to the light source (3), evaluation electronics (5), and with an operating panel (6) arranged above the light source (3) and the light detector (4) of each reflection light sensor (2) for purposes of operating the reflection light sensor (2) by the approach of an object (7), wherein a light guide (8) connected to a housing part (17) is arranged between each operating panel (6) and the light source (3) and the light detector (4) of a reflection light sensor (2), the other housing part (16) has a mounting (25) for a circuit board (14), which contains the reflection light sensor (2) of the optoelectronic control unit (1), a signal light source (9) for emitting light in the visible wavelength range is arranged such that the light emitted by the signal light source (9) in the visible wavelength range can be projected via the light guide (8) onto the operating panel (6), and wherein the connection area (21) is arranged below the operation area (20).

2. The inverter housing (15) according to claim 1, wherein the operating panel (6), or the light guide (8) with the operating panel (6), is produced together with a housing part (16, 17), preferably by the two-component or multi-component injection moulding process.

3. The inverter housing (15) according to claim 1, wherein a seal (18) is arranged between the at least two housing parts (16, 17).

4. The inverter housing (15) according to claim 1, wherein the signal light source (9) of the optoelectronic control unit (1) is arranged between the light source (3) and the light detector (4) of a reflection light sensor (2).

5. The inverter housing (15) according to claim 1, wherein the operating panel (6) of the optoelectronic control unit (1) is formed by the light guide (8).

6. The inverter housing (15) according to claim 1, wherein the light source (3) and the light detector (4) of the reflection light sensor (2) are formed by an infrared light emitting diode and an infrared detector, preferably with transmission and detection maxima at a wavelength $\lambda$ between 850 nm and 900 nm.

7. The inverter housing (15) according to claim 1, wherein the signal light source (9) for the emission of light in the visible wavelength range is formed by an RGB light emitting diode.

8. The inverter housing (15) according to claim 1, wherein the mounting (25) for the circuit board (14) is provided such that the circuit board (14) is arranged at an angle ($\alpha$) between 10° and 170°, preferably essentially 90°, relative to the operating panel (6).

9. The inverter housing (15) according to claim 1, wherein the operating panel (6) and/or the deflection surface (13) of the light guide (8) is of polished construction.

* * * * *